(12) United States Patent
Matsuura

(10) Patent No.: US 7,253,695 B2
(45) Date of Patent: Aug. 7, 2007

(54) FUNCTION GENERATING CIRCUIT AND TEMPERATURE CHARACTERISTIC CONTROLLING METHOD FOR FUNCTION GENERATING CIRCUIT

(75) Inventor: Junichi Matsuura, Tokyo (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 22 days.

(21) Appl. No.: 10/973,400

(22) Filed: Oct. 27, 2004

(65) Prior Publication Data
US 2005/0099239 A1    May 12, 2005

(30) Foreign Application Priority Data
Oct. 27, 2003 (JP) ............ P. 2003-366045

(51) Int. Cl.
*H03L 1/00* (2006.01)
*G01J 5/20* (2006.01)

(52) U.S. Cl. .......... 331/176; 331/66; 327/512

(58) Field of Classification Search ............ 331/66, 331/176; 327/512, 513
See application file for complete search history.

(56) References Cited

U.S. PATENT DOCUMENTS 4,779,161 A * 10/1988 DeShazo, Jr. ............ 361/106
5,719,533 A * 2/1998 Shibuya et al. .......... 331/176
6,603,364 B2 * 8/2003 Nemoto .................... 331/66
6,882,835 B2 * 4/2005 Oka et al. ................. 455/260

FOREIGN PATENT DOCUMENTS

| JP | 8-116214 A | 5/1996 |
|----|-----------|--------|
| JP | 10-270942 A | 10/1998 |
| JP | 3129240 | 11/2000 |
| JP | 3310550 | 5/2002 |
| JP | 2003-152450 | 5/2003 |
| WO | WO 99/03195 | 1/1999 |

* cited by examiner

Primary Examiner—Robert Pascal
Assistant Examiner—James Goodley
(74) Attorney, Agent, or Firm—McDermott Will & Emery LLP

(57) ABSTRACT

In a function generating circuit which comprises a temperature sensor 1 for outputting an output current (Ilin) with a linear temperature characteristic or an output voltage (Vlin) with the linear temperature characteristic, a cubic function generating circuit 2 for receiving the output current (Ilin) or the output voltage (Vlin) of the temperature sensor 1 as an input and generating a cubic temperature characteristic voltage (Vcub), and a control data storing circuit 3 for recording control data to control the output characteristic of the cubic function generating circuit 2, an external control signal is applied to the temperature sensor 1 from an external control terminal 4 to cause the sensor to output variably the output current (Ilin) or the output voltage (Vlin) such that the temperature characteristic of the cubic function generating circuit 2 can be controlled at the ordinary temperature.

13 Claims, 6 Drawing Sheets ary of the Invention

FUNCTION GENERATING CIRCUIT AND TEMPERATURE CHARACTERISTIC CONTROLLING METHOD FOR FUNCTION GENERATING CIRCUIT

SUMMARY OF THE INVENTION

1. Field of the Invention

The present invention relates to a function-generating circuit used in the temperature compensation of a crystal oscillating circuit, and a temperature characteristic controlling method for the function generating circuit.

2. Description of the Related Art

FIG. 9 shows a first configurative example of a function generating circuit used in a temperature compensated crystal oscillator in the prior art. The conventional function generating circuit is composed of a temperature sensor 101 for outputting an output current (Ilin) with a linear temperature characteristic or an output voltage (Vlin) with a linear temperature characteristic; a cubic function generating circuit 102 for receiving the output current (Ilin) or the output voltage (Vlin) with the linear temperature characteristic from the temperature sensor 101 and then generating a cubic temperature characteristic voltage (Vcub) that is in proportion to it; and a PROM (programmable ROM) 103 for recording control data (e.g., coefficients of the cubic functions, constants, etc.) used to control the output characteristic of the cubic function generating circuit 102 (for example, see Japanese Patent No.3310550).

Also, FIG. 10 shows a second configurative example of the function generating circuit in the prior art, and also shows a more particular circuit example of the temperature sensor 101 shown in FIG. 9. In the temperature sensor 101, a first current mirror circuit consisted of NPN transistors Q1, Q2, and Q3, a resistor R1 is connected to an emitter of the NPN transistor Q1 as the primary side, a resistor R2 is connected to an emitter of the NPN transistor Q2 as the first secondary side, and a resistor R3 is connected to an emitter of the NPN transistor Q3 as the second secondary side.

Here, both of the resistor R1 and the resistor R2 are identical in resistance value and temperature characteristic, and the resistor R3 is identical to the resistor R2 in resistance value (at Temp=27° C.) while not identical in temperature characteristic. Also, a constant current I0 having the characteristic that is not affected by the temperature change, is supplied to a collector of the NPN transistor Q1 as the primary side of the first current mirror circuit. In response to this, a current I1 (=I0) flows into the resistor R2, and a current I3 being varied from I0 according to the resistance values of the resistor R3 and the resistor R2 being changed to a temperature flows through the resistor R3. In this case, I1=I3 is given when the resistance value of R3 equal to the resistance value of R2 (at Temp=27° C.).

Also, in the temperature sensor 101, a second current mirror circuit consisted of PNP transistors Q4, Q5 is built, a collector and a base of the PNP transistor Q4 on the primary side of the second current mirror circuit are connected to a collector of the NPN transistor Q2 as the secondary side of the first current mirror circuit, a collector of the PNP transistor Q5 on the secondary side of the second current mirror circuit is connected to a collector of the NPN transistor Q3 as the second secondary side of the first current mirror circuit. Thus, the current I1 (=I0) is supplied to the collector of the PNP transistor Q4, and a current I2 (=I1) is supplied to the collector of the PNP transistor Q5 on the secondary side. The currents I1, I2 are the constant current that is not influenced by the temperature change.

According to such configuration, a current error component (I2−I3) between the currents I2 and I3 caused due to a difference in the temperature characteristic between the emitter resistors R2 and R3 of the first current mirror circuit, is output from the temperature sensor 101 as the output current (Ilin) with the linear temperature characteristic almost linearly varying with the temperature, and then the current error component (I2−I3) being input into the cubic function generating circuit 102 (for example, see Japanese Patent No.3129240).

However, in the conventional function generating circuit 102 as explained above, in order to evaluate the temperature characteristic of the cubic temperature characteristic output voltage of the cubic function generating circuit 102 and then control its characteristic based on the control data recorded in the PROM 103, there was no more than the method that controls the characteristic while actually changing the ambient temperature of the function generating circuit. As a result, extra time and cost were required and the cost is increased.

SUMMARY OF THE INVENTION

The present invention has been made in light of the above circumstances in the related art, and it is an object of the present invention to provide a function generating circuit and a temperature characteristic controlling method for the function generating circuit which are capable of evaluating the temperature characteristic of the function generating circuit at a predetermined temperature.

A function generating circuit of the present invention comprises: a temperature sensor for outputting a temperature characteristic signal in response to an ambient temperature; a function generating portion for generating a function signal having a characteristic corresponding to the ambient temperature based on the temperature characteristic signal; a control data storing portion for recording control data to control the characteristic of the function signal; and an external inputting portion for inputting an external control signal to vary an input of the function generating portion.

According to this configuration, the temperature characteristic of the function generating circuit used for the temperature compensation of the crystal oscillating circuit, or the like, can be evaluated at a predetermined temperature.

Also, in the function generating circuit of the present invention, the external inputting portion is connected to the temperature sensor, and the temperature sensor outputs a signal having a correlation with the temperature characteristic signal that corresponds to a temperature deviated from a predetermined temperature by a desired temperature, in response to the input external control signal in a state that the ambient temperature is at the predetermined temperature.

According to this configuration, the external control signal is input into the temperature sensor and the signal having the correlation with the temperature characteristic signal corresponding to the temperature deviated from the predetermined temperature by the desired temperature is output to the temperature sensor. Thus, the temperature characteristic of the function generating circuit used in the temperature compensation of the crystal oscillating circuit, or the like, can be evaluated at a predetermined temperature.

Also, in the function generating circuit of the present invention, the temperature sensor includes a first conductivity type first transistor to a collector of which a constant current source is connected and a base of which is connected to the collector; a first conductivity type second transistor a base of which is connected to the base of the first transistor;

a first conductivity type third transistor a base of which is connected to the base of the first transistor and the base of the second transistor; a first resistor connected to an emitter of the first transistor, a second resistor connected to an emitter of the second transistor, the second resistor being almost identical to the first resistor in temperature characteristic; a third resistor connected to an emitter of the third transistor, the third resistor being almost identical to the second resistor in resistance value at the predetermined temperature but not in temperature characteristic; a second conductivity type fourth transistor a collector and a base of which are connected to a collector of the second transistor and whose conductivity type is different from the first conductivity type; a second conductivity type fifth transistor a collector of which is connected to a collector of the third transistor and a base of which is connected to the base of the fourth transistor; and an output terminal connected between the collector of the third transistor and the collector of the fifth transistor to output the temperature characteristic signal, and the external inputting portion is connected between the emitter of the third transistor and the third resistor.

According to this configuration, the external inputting portion is connected between the emitter of the third transistor and the third resistor, and the external control signal is input from this external inputting portion, and the signal having the correlation with the temperature characteristic signal corresponding to the temperature deviated from the predetermined temperature by the desired temperature is output to the temperature sensor. Thus, the temperature characteristic of the function generating circuit can be evaluated at a predetermined temperature.

Also, in the function generating circuit of the present invention, the temperature sensor includes: a first conductivity type first transistor to a collector of which a constant current source is connected and a base of which is connected to the collector; a first conductivity type second transistor a base of which is connected to the base of the first transistor; a first conductivity type third transistor a base of which is connected to the base of the first transistor and the base of the second transistor; a first resistor connected to an emitter of the first transistor; a second resistor connected to an emitter of the second transistor, the second resistor being almost identical to the first resistor in temperature characteristic; a third resistor connected to an emitter of the third transistor, the third resistor being different from the second resistor in temperature characteristic; a second conductivity type fourth transistor a collector and a base of which are connected to a collector of the second transistor and whose conductivity type is different from the first conductivity type; a second conductivity type fifth transistor a collector of which is connected to a collector of the third transistor and a base of which is connected to the base of the fourth transistor; a fourth resistor connected to an emitter of the fourth transistor, the fourth resistor being almost identical to the third resistor in temperature characteristic; a fifth resistor connected to an emitter of the fifth transistor, the fifth resistor being almost identical to the first resistor in temperature characteristic; and an output terminal connected between the collector of the third transistor and the collector of the fifth transistor to output the temperature characteristic signal, whereby a ratio of the resistance value of the second resistor and the resistance value of the third resistor is almost identical to a ratio of the resistance value of the fourth resistor and the resistance value of the fifth resistor at the predetermined temperature, and the external inputting portion is connected between the emitter of the third transistor and the third resistor.

According to this configuration, the sensitivity of the temperature sensor can be enhanced, resistance values of respective resistors also can be reduced, and a current value of the constant current source can be made small. Thus, size reduction and power saving of the device can be achieved.

Also, in the function generating circuit of the present invention, the temperature sensor includes: a first conductivity type first MOS transistor to a drain of which a constant current source is connected and a gate of which is connected to the drain; a first conductivity type second MOS transistor a gate of which is connected to the gate of the first MOS transistor; a first conductivity type third MOS transistor a gate of which is connected to the gate of the first MOS transistor and the gate of the second MOS transistor; a first resistor connected to a source of the first MOS transistor; a second resistor connected to a source of the second MOS transistor; the second resistor being almost identical to the first resistor in temperature characteristic; a third resistor connected to a source of the third MOS transistor; the third resistor being almost identical to the second resistor in resistance value at the predetermined temperature but not in temperature characteristic; a second conductivity type fourth MOS transistor a drain and a gate of which are connected to a drain of the second MOS transistor and whose conductivity type is different from the first conductivity type; a second conductivity type fifth MOS transistor a drain of which is connected to a drain of the third MOS transistor and a gate of which is connected to the gate of the fourth MOS transistor; and an output terminal connected between the drain of the third MOS transistor and the drain of the fifth MOS transistor to output the temperature characteristic signal; and the external inputting portion is connected between the source of the third MOS transistor and the third resistor.

According to this configuration, the external inputting portion is connected between the source of the third MOS transistor and the third resistor, and also the external control signal is input from this external inputting portion, and the signal having the correlation with the temperature characteristic signal corresponding to the temperature deviated from the predetermined temperature by the desired temperature is outputted to the temperature sensor. Thus, the temperature characteristic of the function generating circuit can be evaluated at a predetermined temperature.

Also, in the function generating circuit of the present invention, the temperature sensor includes: a first conductivity type first MOS transistor to a drain of which a constant current source is connected and a gate of which is connected to the drain; a first conductivity type second MOS transistor a gate of which is connected to the gate of the first MOS transistor; a first conductivity type third MOS transistor a gate of which is connected to the gate of the first MOS transistor and the gate of the second MOS transistor; a first resistor connected to a source of the first MOS transistor; a second resistor connected to a source of the second MOS transistor, the second resistor being almost identical to the first resistor in temperature characteristic; a third resistor connected to a source of the third MOS transistor, the third resistor being different from the second resistor in temperature characteristic; a second conductivity type fourth MOS transistor a drain and a gate of which are connected to a drain of the second MOS transistor and whose conductivity type is different from the first conductivity type; a second conductivity type fifth MOS transistor a drain of which is connected to a drain of the third MOS transistor and a gate of which is connected to the gate of the fourth MOS transistor; a fourth resistor connected to a source of the fourth MOS transistor, the fourth resistor being almost identical to the third resistor in resistance value and temperature characteristic; a fifth resistor connected to a source of the fifth MOS transistor, the fifth resistor being almost identical to the first resistor in resistance value and temperature characteristic; and an output terminal connected between the drain of the third MOS transistor and the drain of the fifth MOS transistor to output the temperature characteristic signal; whereby a ratio of the resistance value of the second resistor and the resistance value of the third resistor is almost identical to a ratio of the resistance value of the fourth resistor and the resistance value of the fifth resistor at the predetermined temperature, and the external inputting portion is connected between the source of the third MOS transistor and the third resistor.

According to this configuration, the sensitivity of the temperature sensor can be enhanced, resistance values of respective resistors can be reduced, and a current value of the constant current source can be made small. Thus, size reduction and power saving of the device can be achieved.

Also, the function generating circuit of the present invention further comprises a selecting portion for selecting any one of the external control signal from the external inputting portion and the temperature characteristic signal to output the selected signal to the function generating portion.

According to this configuration, the external control signal is input directly to the function generating portion, the signal having the correlation with the temperature characteristic signal corresponding to the temperature deviated from the predetermined temperature by the desired temperature is output to the temperature sensor. Thus, the temperature characteristic of the function generating circuit can be evaluated at a predetermined temperature.

Also, in the function generating circuit of the present invention, the function signal has a cubic function characteristic.

According to this configuration, the temperature characteristic of the function generating circuit can be evaluated at a predetermined temperature even when the function generating circuit is used in the oscillator employing the crystal oscillator having the cubic function frequency-temperature characteristic, and the like.

A temperature compensated crystal oscillating circuit of the present invention comprises the function generating circuit; and an oscillating circuit an oscillation frequency of which is controlled based on the function signal outputted by the function generating circuit.

According to this configuration, the temperature characteristic of the function generating circuit used in the temperature compensated crystal oscillating circuit can be evaluated at a predetermined temperature.

A crystal oscillating module of the present invention comprises: the temperature compensated crystal oscillating circuit; and a crystal oscillator.

According to this configuration, the temperature characteristic of the function generating circuit used in the crystal oscillating module can be evaluated at a predetermined temperature.

A communication terminal of the present invention comprises the crystal oscillating module.

According to this configuration, the communication terminal having the high-precision crystal oscillating module and which is capable of evaluating the temperature characteristic at a predetermined temperature, can be provided.

A communication terminal of the present invention comprises: the temperature compensated crystal oscillating circuit; and a crystal oscillator.

According to this configuration, the communication terminal having the high-precision temperature compensated crystal oscillating circuit and which is capable of evaluating the temperature characteristic at a predetermined temperature, can be provided.

A temperature characteristic controlling method of the present invention for a function generating circuit having: a temperature sensor for outputting a temperature characteristic signal in response to an ambient temperature; a function generating portion for generating a function signal based on an output signal of the temperature sensor; and a control data storing portion for recording control data to control the function signal, comprises: a step of inputting an external control signal to the temperature sensor in a state that the ambient temperature is at a predetermined temperature; and a step of generating the function signal in response to the temperature characteristic signal that is output in answer to the input external control signal.

According to this configuration, the temperature characteristic controlling method for the function generating circuit which is capable of controlling the temperature characteristic at a predetermined temperature, can be provided.

According to the present invention, the function generating circuit and the temperature characteristic controlling method for the function generating circuit which are capable of evaluating the temperature characteristic of the function generating circuit at a predetermined temperature, and can be provided.

DESCRIPTION OF THE PREFERRED EMBODIMENTS (First Embodiment)

Figure 1:
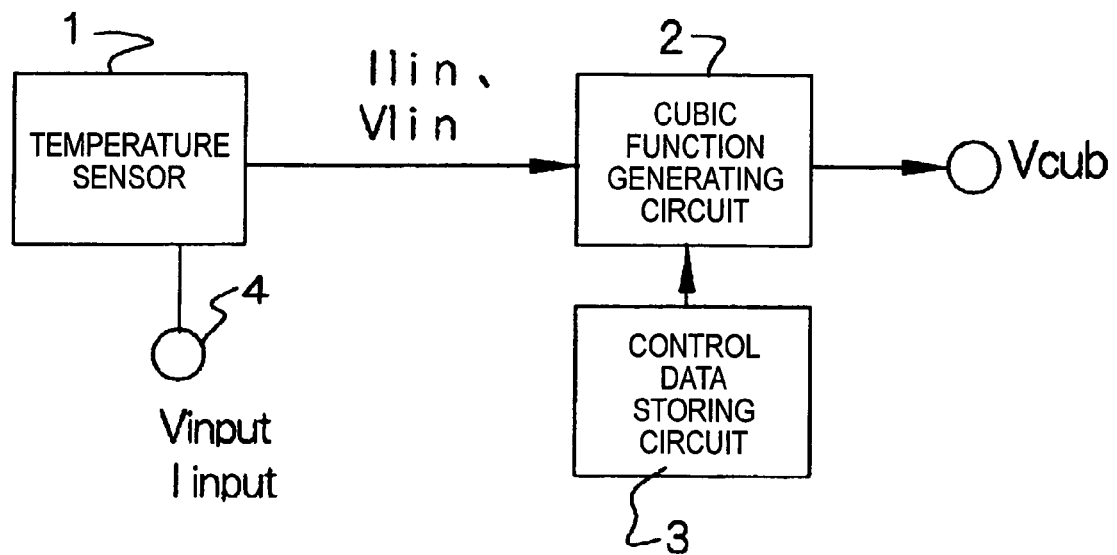
FIG. 1 shows a configurative example of a function generating circuit to explain a first embodiment of the present invention.

FIG. 1 shows a schematic configuration of a function generating circuit to explain a first embodiment of the present invention, e.g., a function generating circuit used for the temperature compensated crystal oscillator (TCXO). As shown in FIG. 1, the function generating circuit of the present embodiment has a temperature sensor 1, a cubic function generating circuit 2, a control data storing circuit 3, and an external control terminal 4.

The temperature sensor 1 outputs a temperature characteristic signal in response to the ambient temperature, e.g., an output current (Ilin) with a linear temperature characteristic that is in proportion to the temperature or an output voltage (Vlin) with a linear temperature characteristic that is in proportion to the temperature. The cubic function generating circuit 2 receives a function signal having the characteristic responding to the ambient temperature based on the temperature characteristic signal as an input, e.g., the output current (Ilin) with the linear temperature characteristic from the temperature sensor 1 or the output voltage (Vlin) with the linear temperature characteristic from the temperature sensor 1, and then generates the cubic temperature characteristic voltage Vcub that is proportional to this input.

The control data storing circuit 3 has a PROM (Programmable ROM), a RAM (Random Access Memory), or the like. And the control data storing circuit 3 controls the output characteristic of the cubic function generating circuit 2 according to the control data (e.g., coefficients of the cubic function, constants, etc.) recorded in the PROM, or the like.

Also, the external control terminal 4 is provided with the temperature sensor 1. By applying an external control signal, e.g., a control voltage (Vinput) or a control current (Iinput) to the external control terminal 4, a value of the output current (Ilin) or the output voltage (Vlin) of the temperature sensor 1 at a predetermined temperature (e.g., an ordinary temperature T0) can be controlled variably. That is, a function that is capable of varying the input of the cubic function generating circuit 2 is added. In this case, in the present embodiment, the case where the predetermined temperature is set to the ordinary temperature T0 (e.g., 27° C.) is explained, but the present invention is not limited to this embodiment.

According to this configuration, the temperature sensor 1 receives the control voltage Vinput or the control current Iinput from the external control terminal 4, and then changes a value of the output current (Ilin) or the output voltage (Vlin) so that that value of the output current (Ilin) or the output voltage (Vlin) is correlated with the temperature characteristic of the temperature sensor 1. Thus, the characteristic of the cubic temperature characteristic voltage that the cubic function generating circuit 2 generates can be evaluated artificially at the ordinary temperature, and then the characteristic can be controlled by using the control data (e.g., coefficients of the cubic function, constants, etc.) recorded in the control data storing circuit 3. As a result, since the temperature characteristic of this cubic function generating circuit 2 is controlled at the ordinary temperature, for instance, the temperature compensation controlling of the oscillation frequency of the crystal oscillating circuit can be carried out at the ordinary temperature when the product is manufactured by such crystal oscillating circuit together with the quartz as TCXO.

Figure 2:
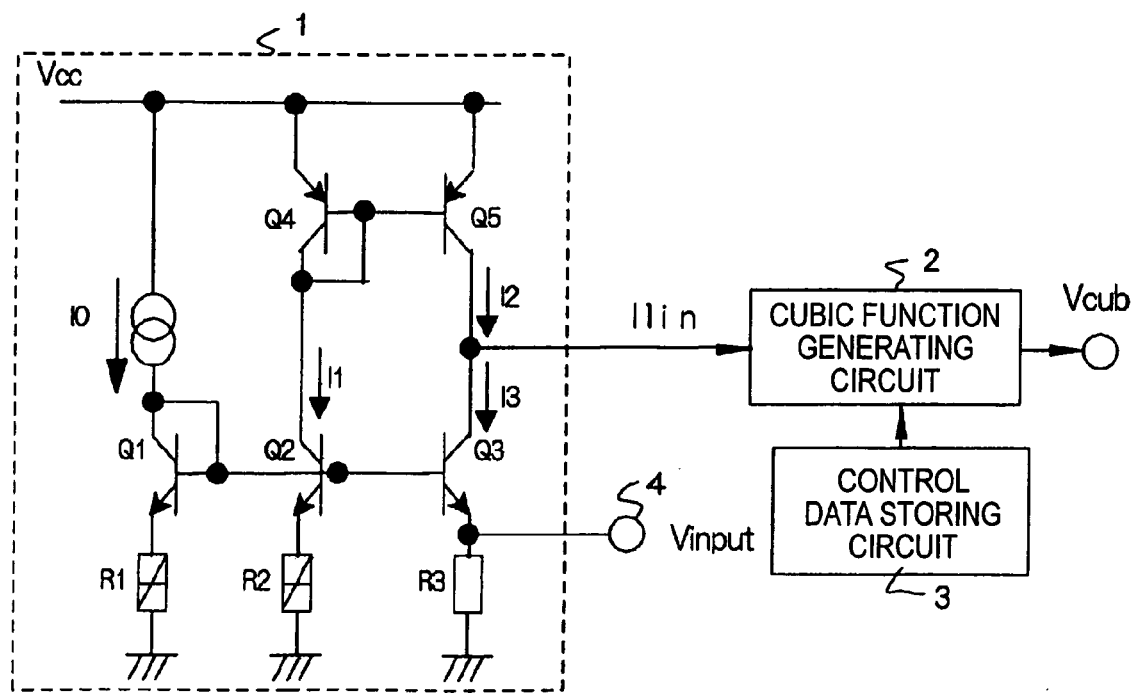
FIG. 2 shows a first circuit configurative example of a temperature sensor.

FIG. 2 shows a first circuit configurative example of the temperature sensor 1, and shows the temperature sensor 1 shown in FIG. 1 as a more particular circuit example. In the temperature sensor 1, the first current mirror circuit having the NPN transistors Q1, Q2, and Q3 is built, and the resistor R1 is connected to the emitter of the NPN transistor Q1 as the primary side, the resistor R2 is connected to the emitter of the NPN transistor Q2 as the first secondary side, and the resistor R3 is connected to the emitter of the NPN transistor Q3 as the second secondary side.

Here, the resistor R1 and the resistor R2 are almost identical in resistance value and temperature characteristic, and the resistor R3 is almost identical to the resistor R2 in resistance value at the ordinary temperature while not identical in temperature characteristic.

Also, the constant current I0 having the characteristic affected by the temperature change is supplied to the collector of the NPN transistor Q1 on the primary side of the first current mirror circuit. In response to this, the current I1 (=I0) flows into the resistor R2 and the current I3 varied according to the temperature change in the resistance values of the resistor R3 and the resistor R2 flows into the resistor R3. In this case, I1=I3 is given when the resistance value of R3=R2 (T0).

Also, In the temperature sensor 1, the second current mirror circuit having the PNP transistors Q4, Q5 is built. The collector and the base of the PNP transistor Q4 on the primary side of the second current mirror circuit are connected to the collector of the NPN transistor Q2 as the secondary side of the first current mirror circuit.

The collector of the PNP transistor Q5 on the chilled side of the second current mirror circuit is connected to the collector of the NPN transistor Q3 as the second secondary side of the first current mirror circuit. Then, the current I1 (=I0) is supplied to the collector of the PNP transistor Q4 on the primary side, and the current I2 (=I1) is supplied to the collector of the PNP transistor Q5 on the secondary side. The currents I1, I2 are the constant current that is not influenced by the temperature change.

According to such configuration, a current error component (I2−I3) between the currents I2 and I3 caused due to a difference in temperature characteristic between the emitter resistors R2 and R3 of the first current mirror circuit is output as the output current (Ilin) of the temperature sensor 1, which changes almost linearly with the temperature.

Then, the control voltage (Vinput) is input at the ordinary temperature from the external control terminal 4 connected to the emitter resistor R3 of the NPN transistor Q3 on the second secondary side of the first current miller circuit. Then, the value of the output current (Ilin) is varied so as to being correlated with the temperature characteristic of the temperature sensor 1. Thus, the characteristic of the cubic temperature characteristic voltage that the cubic function generating circuit 2 generates can be evaluated artificially at the ordinary temperature, and then the characteristic can be controlled by using the control data recorded in the control data storing circuit 3.

Next, particular operations of the temperature sensor shown in FIG. 2 and the principle of the temperature characteristic control will be explained hereunder.

Figure 7:
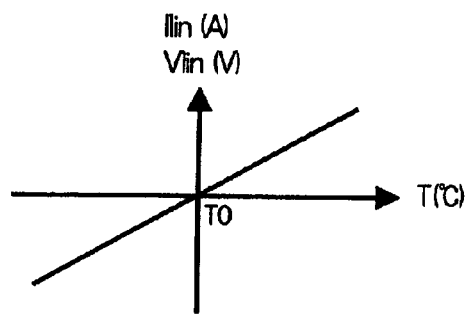
FIG. 7 is a characteristic view of output signals of respective portions of the function generating circuit according to the embodiment of the present invention.
Figure 7:
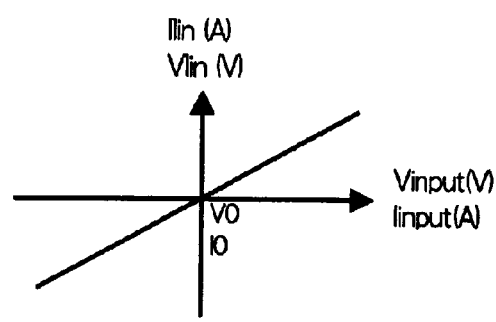
Figure 7:
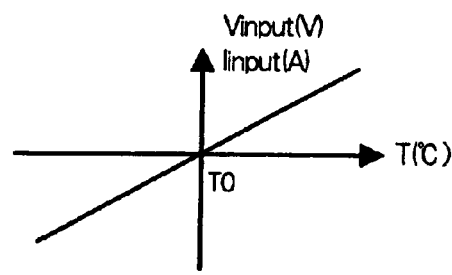
Figure 7:
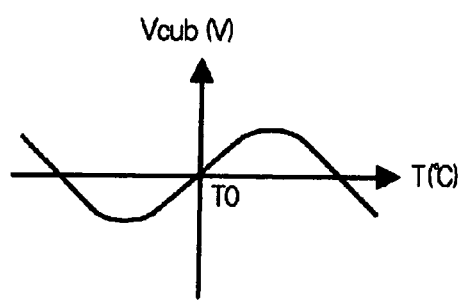
Figure 7:
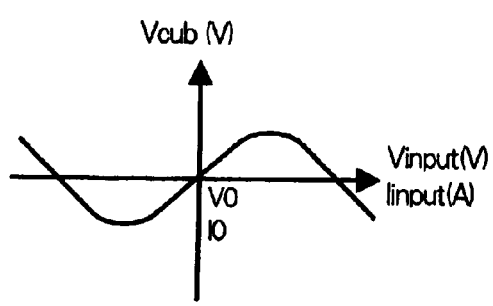

FIG. 7(*a*) shows an output characteristic of the output current (Ilin) or the output voltage (Vlin) of the temperature sensor 1 with respect to the temperature. A particular example of this characteristic will be explained with reference to the operation of the temperature sensor circuit shown in FIG. 2.

In the first current mirror circuit having the NPN transistors Q1, Q2, Q3 in the temperature sensor in FIG. 2, the resistors R1 and R2 having the almost same temperature characteristic and the almost same resistance value are connected to the emitters of the NPN transistor Q1 and the NPN transistor Q2 respectively. Thus, the constant current I1 having the characteristic that is almost identical to I0 and is not affected by the temperature change (I1=I0) flows into the resistor R2.

The resistor R3 that is almost identical to the resistors R1, R2 connected to the emitters of Q1 and Q2 respectively in resistance value at the ordinary temperature T0, but not identical in temperature characteristic, is connected to the emitter of the NPN transistor Q3. Thus, when the temperature is deviated from the ordinary temperature, the current changed from I0 by a difference component in the temperature characteristic between the resistors R3 and R2, flows into R3. Also, since the current I2 is a mirrored current of I1 by using the second current mirror circuit having the NPN transistors Q4, Q5, such current I2 is the constant current that is not influenced by the temperature change like I1.

Here, the current I3 with respect to the temperature T is given by $$I3 \approx \{1-(T-T0) \times (\Delta r2t - \Delta r1t)\} \times I0 \qquad (1)$$

where $\Delta r1\, t$ is a linear temperature characteristic coefficient of the resistor R2, and $\Delta r2\, t$ is a linear temperature characteristic coefficient of the resistor R3. Also, the current I2 is given by $$I2 = I0 \qquad (2)$$

Then, a current error component between I2 and I3 with respect to the temperature change is output in the output of the temperature sensor 1 as the output current Ilin. Thus, according to Eqs.(1) (2), Ilin is given by $$\begin{aligned} Ilin &= I2 - I3 \\ &\approx (T-T0) \times (\Delta r2t - \Delta r1t) \times I0 \end{aligned} \qquad (3)$$

Therefore, Ilin shows the output current characteristic changing linearly with respect to the temperature T, as shown in FIG. 7(a).

FIG. 7(b) shows the output characteristic of the output voltage (Vcub) of the cubic function generating circuit 2 with respect to the temperature T. The particular example of this characteristic will be explained with reference to an operation of the circuit example shown in FIG. 2. The function generating circuit 2 outputs the output voltage (Vcub) obtained by adding a component that is proportional to the third power of the input current value in this input, a component that is proportional to the first power, and a component that is proportional to the zero power.

Here, since the input current Ilin is represented by Eq.(3), the output voltage (Vcub) is given by $$\begin{aligned} Vcub &= \alpha \times Ilin^3 + \beta \times Ilin + \gamma \\ &\approx \alpha \times \{(T-T0) \times (\Delta r2t - \Delta r1t) \times I0\}^3 + \beta \times \\ &\quad \{(T-T0) \times (\Delta r2t - \Delta r1t) \times I0\} + \gamma \end{aligned} \qquad (4)$$

where α is a proportional coefficient of the third power, β is a proportional coefficient of the first power, and γ is a proportional coefficient of the zero power. Thus, the output voltage (Vcub) exhibits the output voltage characteristic that changes cubically with respect to the temperature, as shown in FIG. 7(b).

Next, an example of the case where the control voltage (Vinput) or the control current (Iinput) is input into the external control terminal 4 of the temperature sensor 1 so as to change the output current (Ilin) or the output voltage (Vlin) of the temperature sensor, will be explained hereunder.

FIG. 7(c) shows the output characteristic of the output current (Ilin) or the output voltage (Vlin) of the temperature sensor with respect to the control voltage (Vinput) or the control current (Iinput). The particular example of this characteristic will be explained with reference to the operation of the temperature sensor circuit shown in FIG. 2.

The external control terminal 4 is connected between the NPN transistor Q3 and the emitter resistor R3. When the control voltage (Vinput), for example, is input into the external control terminal 4 at the ordinary temperature (T=T0), this situation is equivalent to the case where the resistance value of R3 is changed by an amount derived by dividing a difference between Vinput and an emitter voltage VEdef of Q3 before this Vinput is input by I0.

Accordingly, the current I3 is given by Eq.(5), where VEdef is given by Eq.(6).

$$I3 \approx \{1 - (Vinput - VEdef)/(I0 \times R3)\} \times I0 \qquad (5)$$

$$VEdef = I0 \times R3 \qquad (6)$$

According to Eqs.(2), (5), (6), the output current Ilin of the temperature sensor 1 at this time is given by $$Ilin = I2 - I3 \approx (Vinput/R3) - I0 \qquad (7)$$

As a result, the output current Ilin shows the characteristic changing linearly with respect to the control voltage (Vinput), as shown in FIG. 7(c).

FIG. 7(e) shows the output characteristic of the output voltage (Vcub) of the cubic function generating circuit 2 with respect to the control voltage (Vinput) or the control current (Iinput). The particular example of this characteristic will be explained with reference to the circuit operation of the temperature sensor 1 shown in FIG. 2. Like FIG. 7(b), since the input current Ilin is represented by Eq.(7), the output voltage (Vcub) is given by $$\begin{aligned} Vcub &= \alpha \times Ilin^3 + \beta \times Ilin + \gamma \\ &\approx \alpha \times (Vinput/R3 - I0)^3 + \beta \times (Vinput/R3 - I0) + \gamma \end{aligned} \qquad (8)$$

Thus, the output voltage (Vcub) becomes the output voltage changing cubically with respect to the control voltage (Vinput) as shown in FIG. 7(e). It is understandable from the above explanation that the output voltage (Vcub) has the characteristic changing cubically with respect to both the temperature T and the control voltage (Vinput).

Now a correlation between the temperature T and the control voltage (Vinput) or the control current (Iinput) with respect to the cubic output voltage (Vcub) in FIG. 2, can be expressed as in FIG. 7(d). This particular example is also explained by using the example in FIG. 2. According to the relationships given by Eqs.(3) (7), the control voltage (Vinput) is given by Eq.(9) and can be represented by the linear correlation, as shown in FIG. 7(d).

$$Vinput = \{1 + (\Delta r2t - \Delta r1t) \times (T-T0)\} \times I0 \times R3 \qquad (9)$$

With the above, an example of the circuit configuration of the temperature sensor of the present embodiment is explained with reference to FIG. 2. Then, another example of the circuit configuration of the temperature sensor will be explained hereunder.

Figure 3:
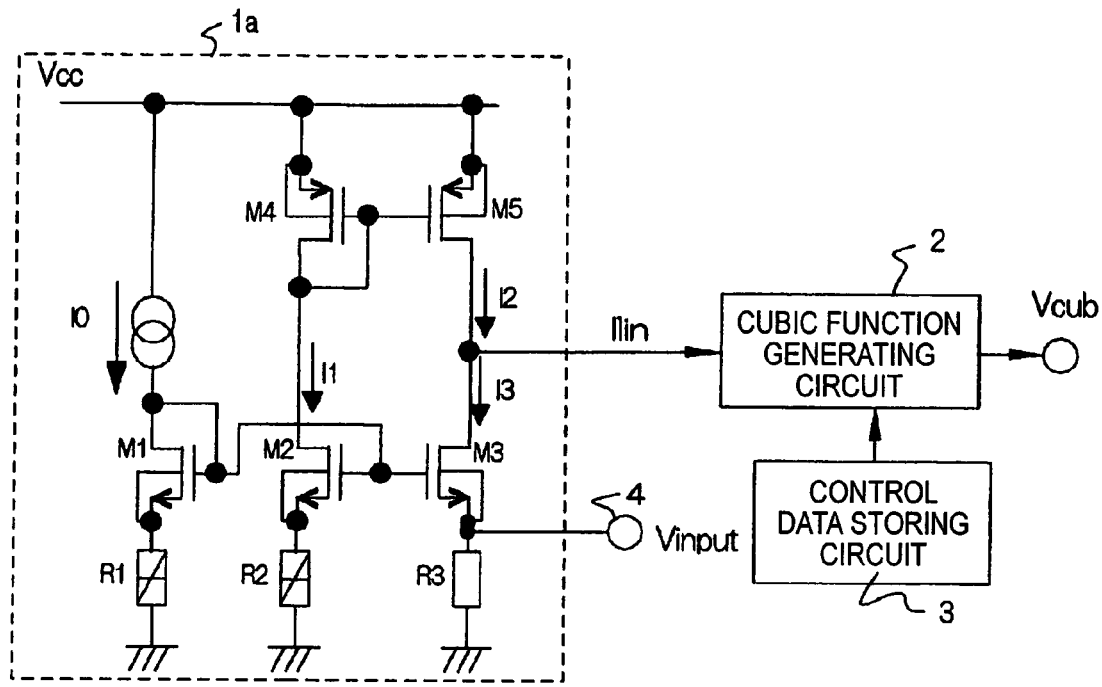
FIG. 3 shows a second circuit configurative example of a temperature sensor.

For example, in a second circuit configurative example of the temperature sensor shown in FIG. 3, a temperature sensor 1a is composed of MOS transistors. That is, the NPN transistors in the temperature sensor 1 shown in FIG. 2 are replaced with NchMOS transistors and the PNP transistors are replaced with PchMOS transistors. In addition, the characteristic and the effect are equivalent to those of the temperature sensor 1 shown in FIG. 2. In this manner, in case such that the temperature sensor 1a is composed of the MOS transistors, improvement in the integration degree and reduction in the production cost can be achieved when the function generating circuit is integrated on the semiconductor substrate.

Figure 4:
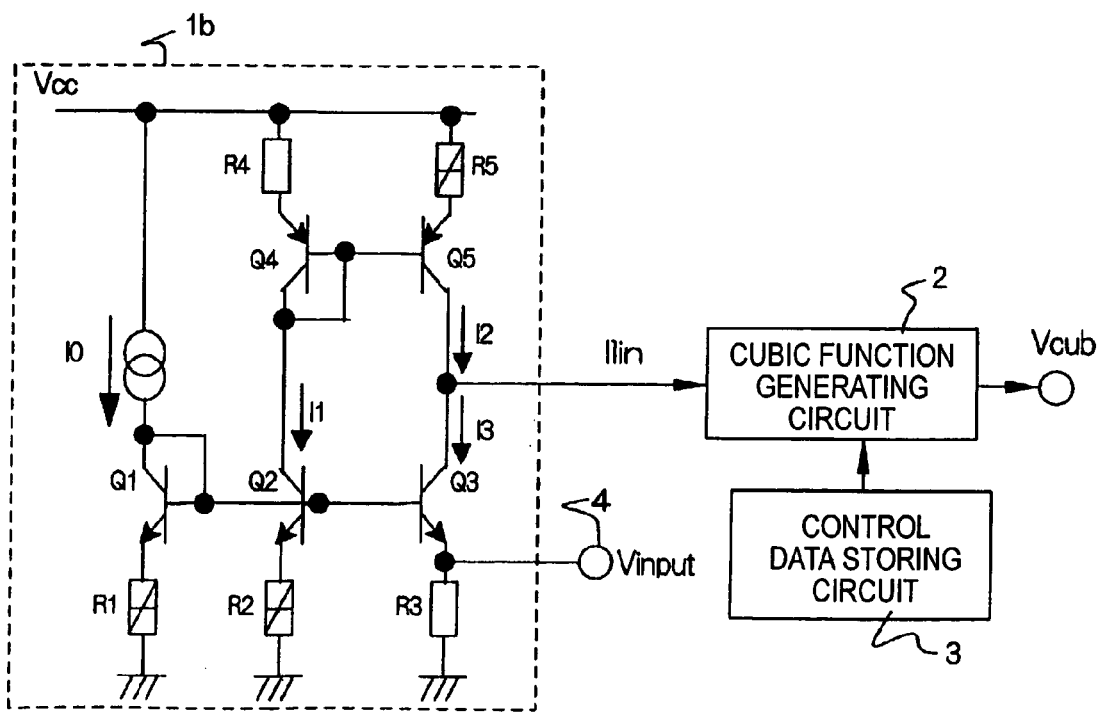
FIG. 4 shows a third circuit configurative example of a temperature sensor.

Also, in a third circuit configurative example of the temperature sensor shown in FIG. 4, a resistor R4 having the almost same temperature characteristic as the resistor R3 inserted into the emitter of the NPN transistor Q3 on the second secondary side of the first current mirror circuit, is inserted into the emitter of the PNP transistor Q4 on the primary side of the second current mirror circuit. Also, a resistor R5 having the almost same temperature characteristic as the resistor R2 inserted into the emitter of the NPN transistor Q2 on the first secondary side of the first current mirror circuit, is inserted into the emitter of the PNP transistor Q5 on the secondary side of the second current mirror circuit.

Here, a ratio of the resistance value of the resistor R4 and the resistance value of the resistor R5 at the ordinary temperature T0 is almost identical to a ratio of the resistance value of the resistor R2 and the resistance value of the resistor R3.

Accordingly, the output current (Ilin) of the temperature sensor 1b obtained based on the temperature characteristic becomes about twice the output current of the temperature sensor 1 shown in FIG. 2. But other characteristics and effects are equivalent to those of the temperature sensor 1 shown in FIG. 2.

In the example of the temperature sensor 1b shown in FIG. 4, the temperature characteristic of the output current (Ilin) of the temperature sensor 1b becomes about twice the temperature sensor 1 shown in FIG. 2 (its sensitivity is increased). Thus, the resistance values of the resistors R1 to R6 can be reduced and a size of the resistor element side can be reduced (or areas of the resistors can be made small when the temperature sensor 1 is integrated on the semiconductor substrate), and at the same time a current value of the constant current (I0) can be decreased. As a result, size reduction and power saving of the device can be achieved.

Figure 5:
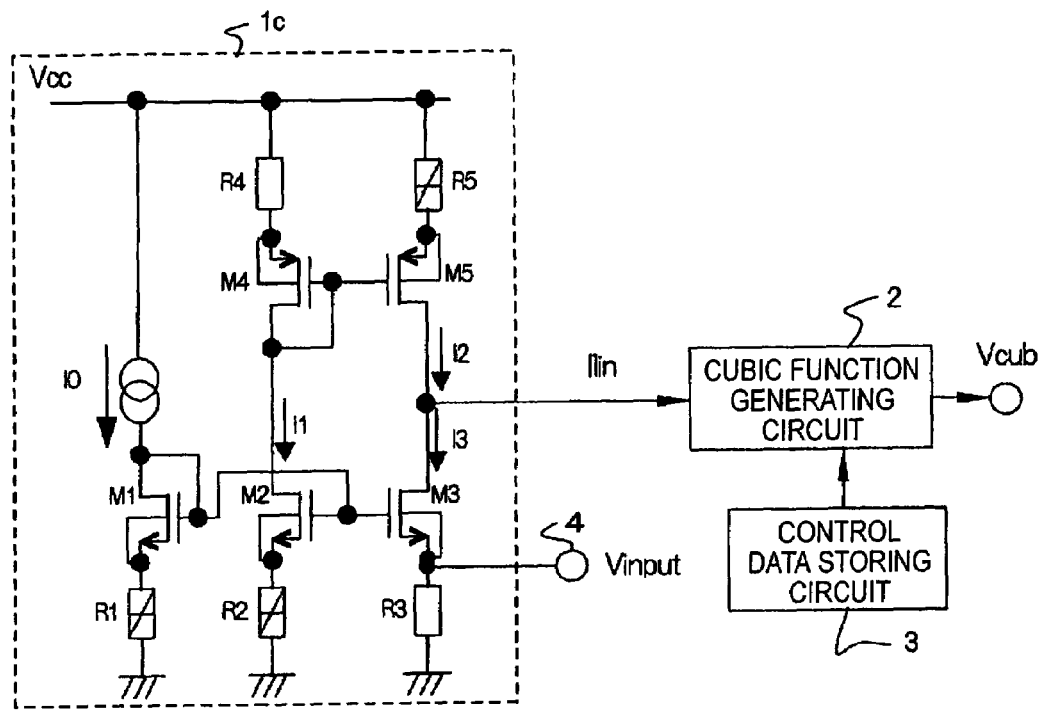
FIG. 5 shows a fourth circuit configurative example of a temperature sensor.

Also, in a fourth circuit configurative example of the temperature sensor shown in FIG. 5, in a configuration of a temperature sensor 1c, the NPN transistors of the temperature sensor 1b shown in FIG. 4 are replaced with NchMOS transistors and the PNP transistors are replaced with PchMOS transistors. But the characteristics and effects are equivalent to those shown in FIG. 4.

Figure 8:
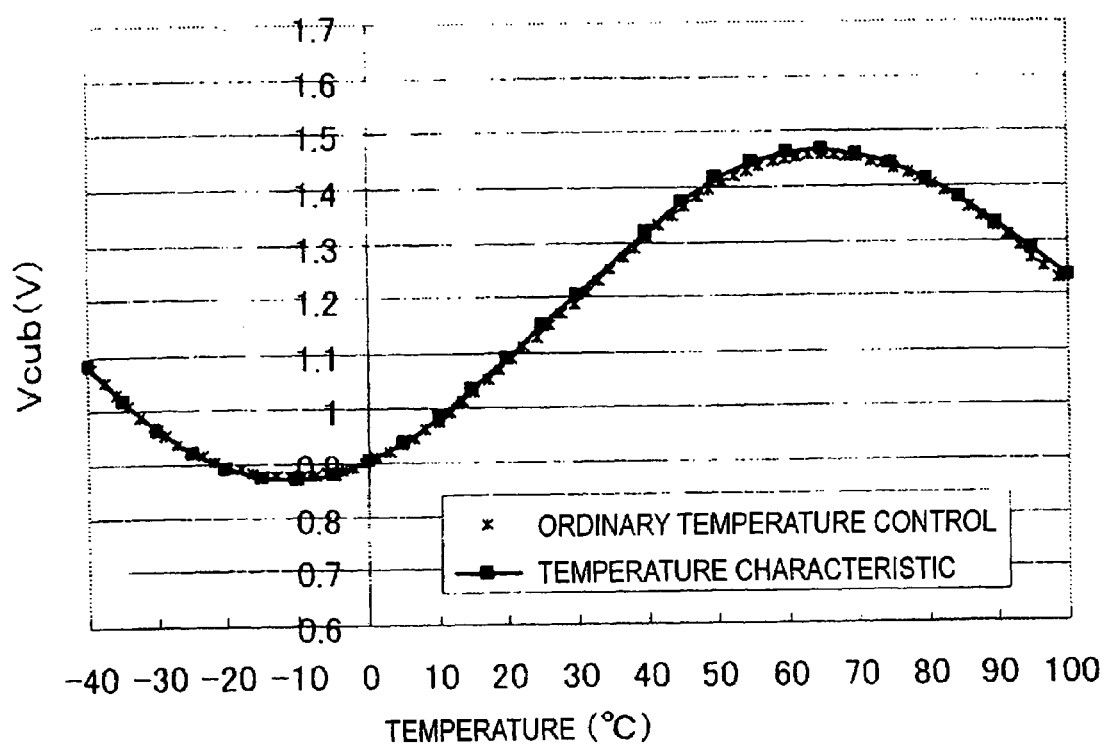
FIG. 8 shows measured results of the temperature characteristic of an output voltage Vcub.
Figure 9:
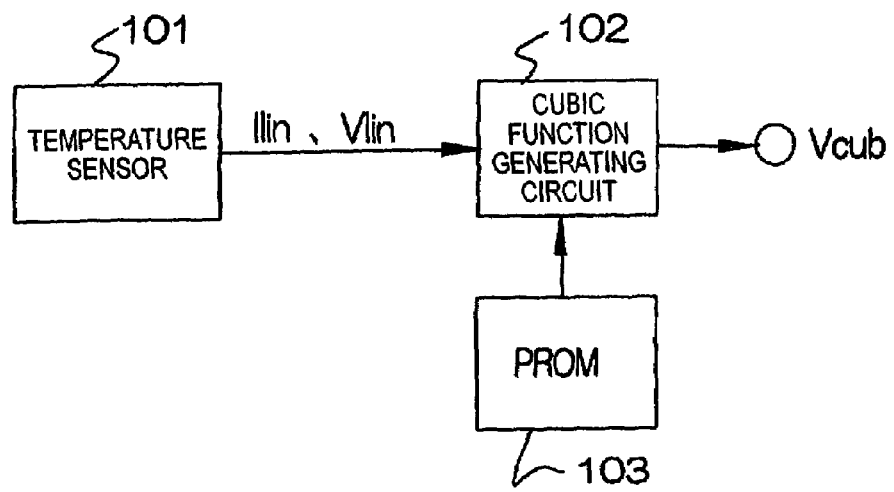
FIG. 9 shows a first configurative example of a function generating circuit in the prior art.
Figure 10:
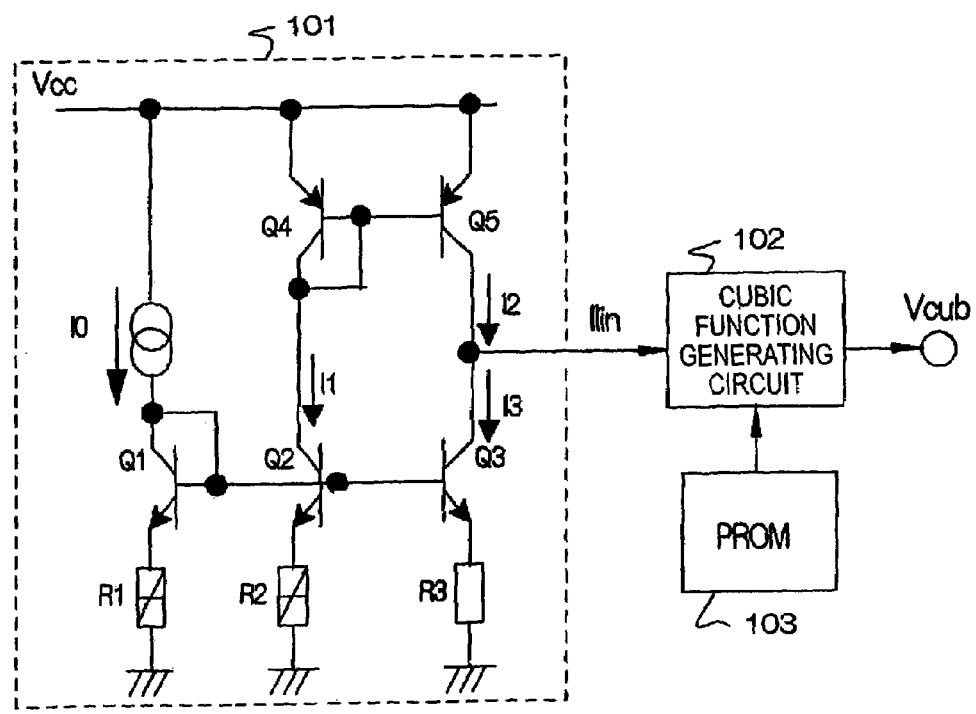
FIG. 10 shows a second configurative example of a function generating circuit in the prior art.

FIG. 8 expresses: measured results of the temperature characteristic of the output voltage Vcub; and measured results of the output characteristic of the output voltage Vcub when the control voltage Vinput is changed at the ordinary temperature; as a result in case that the voltage value of Vinput is converted into the temperature T based on the relationship in above Eq.(9), after the function generating circuit shown in FIG. 4 is actually manufactured. It is understood from FIG. 8 that measured results of the temperature characteristic of the output voltage Vcub coincides substantially with results of the output characteristic of the output voltage Vcub measured when the control voltage Vinput is changed at the ordinary temperature.

According to such function generating circuit of the first embodiment, if the control signal, i.e., the control voltage (Vinput) or the control current (Iinput) is input from the external control terminal 4 of the temperature sensor, and then the output signal is changed so as to being correlated with the temperature characteristic of the output signal of the temperature sensor 1, i.e., the output current (Ilin) or the output voltage (Vlin), the temperature characteristic of the cubic temperature characteristic voltage of the cubic function generating circuit 2 can be evaluated artificially at the ordinary temperature and also the output characteristic can be controlled by the control data storing circuit 3.

Therefore, in case such that the temperature compensated crystal oscillating circuit in which the oscillation frequency is controlled based on the output signal output from the function generating circuit is manufactured or the crystal oscillating module having this temperature compensated crystal oscillating circuit and the crystal oscillator is manufactured, the temperature compensation control of the oscillation frequency of the crystal oscillating circuit can be carried out at the ordinary temperature.

In particular, since variation in the characteristics of the crystal oscillating circuit enormously affects the communication quality in the communication device such as the cellular phone, a high-precision crystal oscillating circuit is requested. Thus, the temperature compensation of the crystal oscillating circuit becomes important. In this case, since the temperature compensation control can be executed at the ordinary temperature, it is not required to change the ambient temperature actually and thus time and steps required for the manufacture can be reduced. Where the crystal oscillating circuit and the crystal oscillator may be provided separately to the communication device, otherwise the module containing the crystal oscillating circuit and the crystal oscillator may be provided.

In this case, particular circuit examples for voltage input/current output of the temperature sensor 1 are shown in FIG. 2 to FIG. 5. But the present invention is not limited to these configurations, and the control signal and the output signal may be represented by any of the voltage and the current.

(Second Embodiment)

In the first embodiment, it is shown that the example in which the output current (Ilin) or the output voltage (Vlin) from the temperature sensor 1 is changed by providing the external control terminal 4 to the temperature sensor 1. In a second embodiment of the present invention, en example in which the input current or the input voltage of the cubic function generating circuit 2 is varied directly while using the conventional temperature sensor as it is will be explained hereunder.

Figure 6:
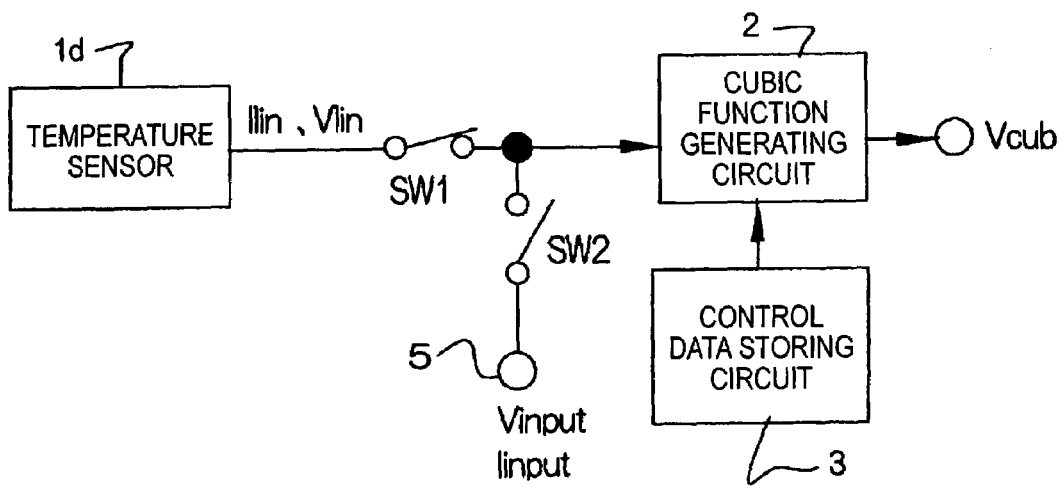
FIG. 6 shows a configurative example of a function generating circuit to explain a second embodiment of the present invention.

FIG. 6 shows a schematic configurative example of a function generating circuit to explain a second embodiment of the present invention. The same reference symbols are affixed to portions that overlap with those in FIG. 1 explained in the first embodiment. As shown in FIG. 6, a function generating circuit of the second embodiment has a temperature sensor 1d, the cubic function generating circuit 2, and the control data storing circuit 3.

The temperature sensor 1d outputs the temperature characteristic signal in response to the ambient temperature, e.g., the linear temperature characteristic current (Ilin) or the linear temperature characteristic voltage (Vlin) that is in proportion to the temperature. The cubic function generating circuit 2 receives a function signal having the characteristic according to the ambient temperature based on the temperature characteristic signal, e.g., the linear temperature characteristic current (Ilin) or the linear temperature characteristic voltage (Vlin) from the temperature sensor 1d. Then cubic function generating circuit 2 generates the cubic temperature characteristic voltage (Vcub) that is proportional to the signal.

The control data storing circuit 3 has PROM, RAM. The control data storing circuit 3 controls the output characteristic of the cubic function generating circuit 2 by control data (e.g., coefficients of the cubic function, constants, etc.) recorded in PROM, RAM.

Also, a switch SW1 for switching the connection and the disconnection is inserted between an output of the temperature sensor 1d and the input of the cubic function generating circuit 2. Also, an external control terminal 5 connected directly to the input of the cubic function generating circuit 2 via a switch SW2 is provided. A function capable of varying directly the input current or the input voltage of the cubic function generating circuit 2 by applying the external control signal, e.g., the control voltage (Vinput) or the control current (Iinput) from the external control terminal 5 at the ordinary temperature, is added.

According to such configuration, in the situation that SW1 is turned ON and SW2 is turned OFF, the output current (Ilin) or the output voltage (Vlin) from the temperature sensor 1d is input into the cubic function generating circuit 2 so as to generate the cubic temperature characteristic voltage (Vcub) in response to the normal temperature change in the temperature sensor 1d. And, in the situation that SW1 is turned OFF and SW2 is turned ON, the control voltage (Vinput) or the control current (Iinput) is input from the external control terminal 5 and also the output voltage (Vcub) of the cubic function generating circuit 2 is changed so as to being correlated with the temperature characteristic of the output current (Ilin) or the output voltage (Vlin) from the temperature sensor 1d. Thus, the temperature characteristic of the cubic temperature characteristic voltage generated by the cubic function generating circuit 2 can be evaluated artificially at the ordinary temperature. Also, such characteristic can be controlled by the control data (e.g., coefficients of the cubic function, constants, etc.) recorded in the control data storing circuit 3.

Next, the particular operation of the function generating circuit shown in FIG. 6 and the principle of the temperature characteristic control will be explained hereunder.

FIG. 7(a) shows the output current (Ilin) or the output voltage (Vlin) from the temperature sensor 1d with respect to the temperature T. Where the temperature sensor 1d outputs the current or the voltage having the linear characteristic with respect to the temperature. Thus, Ilin or Vlin is expressed to have the linear characteristic given by $$Ilin = B1 \times (T-T0) + I0 \quad (10)$$

$$Vlin = B2 \times (T-T0) + V0 \quad (11)$$

where B1, B2 are linear temperature coefficients, and I0, V0 are offsets of Ilin and Vlin at the ordinary temperature.

When SW1 is turned ON and SW2 is turned OFF, the current or the voltage expressed by Eq.(10) or Eq.(11) is input into the cubic function generating circuit 2. Then, the cubic function generating circuit 2 outputs the output voltage (Vcub) obtained by adding a component that is proportional to the third power of the input current value or voltage value in this input, a component that is proportional to the first power, and a component that is proportional to the zero power. Thus, the output voltage (Vcub) is given by $$Vcub = \alpha1 \times Ilin^3 + \beta1 \times Ilin + \gamma1 \quad (12)$$
$$\approx \alpha1 \times \{B1 \times (T-T0) + I0\}^3 +$$
$$\beta1 \times \{B1 \times (T-T0) + I0\} + \gamma1$$

or $$Vcub = \alpha2 \times Vlin^3 + \beta2 \times Vlin + \gamma2 \quad (13)$$
$$\approx \alpha2 \times \{B2 \times (T-T0) + V0\}^3 +$$
$$\beta2 \times \{B2 \times (T-T0) + V0\} + \gamma2$$

where $\alpha1$, $\alpha2$ are proportional coefficients of the third power, $\beta1$, $\beta2$ are proportional coefficients of the first power, and $\gamma1$, $\gamma2$ are proportional coefficients of the zero power. Thus, the output voltage (Vcub) shows the output characteristic that changed cubically with respect to the temperature, as shown in FIG. 7(b).

FIG. 7(c) shows the characteristic of the input current (Ilin) or the input voltage (Vlin) of the cubic function generating circuit 2 with respect to the control voltage (Vinput) or the control current (Iinput) when SW1 is turned OFF and SW2 is turned ON. At this time, since the external control terminal 5 is connected directly to the input of the cubic function generating circuit 2, Vlin or Ilin is given by $$Vlin = Vinput \quad (14)$$

$$Ilin = Iinput \quad (15)$$

Accordingly, the output voltage (Vcub) is given by $$Vcub = \alpha1 \times Iinput^3 + \beta1 \times Iinput + \gamma1 \quad (16)$$

or $$Vcub = \alpha2 \times Vinput^3 + \beta2 \times Vinput + \gamma2 \quad (17)$$

Thus, the output voltage (Vcub) exhibits the output characteristic changing cubically with respect to the control signal, i.e., the control voltage (Vinput) or the control current (Iinput), as shown in FIG. 7(e).

With the above, it can be seen that the output voltage (Vcub) has the characteristic changing cubically with respect to both the temperature T and the control voltage (Vinput) or the control current (Iinput).

Here, the correlation between the temperature T and the control voltage (Vinput) or the control current (Iinput) with respect to the cubic output voltage (Vcub) in FIG. 6 can be expressed by the linear correlation, as shown in FIG. 7(d), since the relationship given by Eq.(18) or Eq.(19) is satisfied according to Eqs.(10),(14) or Eqs.(11),(15).

$$Iinput = B1 \times (T-T0) + I0 \quad (18)$$

$$Vinput = B2 \times (T-T0) + V0 \quad (19)$$

According to such function generating circuit of the second embodiment, the control signal input from the external control terminal 5, i.e., the control voltage (Vinput) or the control current (Iinput) is changed to so as to be correlated with the temperature characteristic of the output signal, i.e., the output current (Ilin) or the output voltage (Vlin) from the temperature sensor 1d. Thus, the temperature characteristic of the cubic temperature characteristic voltage generated by the cubic function generating circuit 2 can be evaluated artificially at the ordinary temperature, and also such characteristic of the cubic function generating circuit 2 can be controlled by the control data (e.g., coefficients of the cubic function, constants, etc.) recorded in the control data storing circuit 3.

As a result, when the temperature compensated crystal oscillating circuit in which the oscillation frequency is controlled based on the output signal output from the function generating circuit is manufactured or the crystal oscillating module having this temperature compensated crystal oscillating circuit and the crystal oscillator is manufactured, the temperature compensation control of the oscillation frequency of the crystal oscillating circuit can be carried out at the ordinary temperature.

The function generating circuit and its temperature characteristic controlling method of the present invention have an effect of capable of evaluating the temperature characteristic of the function generating circuit at a predetermined temperature, and are valuable for the temperature compensated crystal oscillator, the crystal oscillating module having the temperature compensated crystal oscillator and the crystal oscillator, and the communication device such as the mobile phone having them, etc.

What is claimed is:

1. A function generating circuit comprising:
   a temperature sensor, outputting a temperature characteristic signal in response to an ambient temperature;
   a function generating portion, generating a function signal having a characteristic corresponding to the ambient temperature based on the temperature characteristic signal;
   a control data storing portion, recording control data to control the characteristic of the function signal; and
   an external inputting portion, inputting an external control signal to vary an input of the function generating portion,
   wherein the temperature sensor outputs a difference between a first current generated by a resistor including a first linear temperature characteristic and a second current generated by a resistor including a second linear temperature characteristic as the temperature characteristic signal which is in proportion to the temperature, and varies a value of the first current or a value of the second current based on the external control signal.

2. The function generating circuit according to claim 1, wherein the external inputting portion is connected to the temperature sensor, and
   the temperature sensor outputs a signal having a correlation with the temperature characteristic signal that corresponds to a temperature deviated from a predetermined temperature by a desired temperature, in response to the input external control signal in a state that the ambient temperature is at the predetermined temperature.

3. The function generating circuit according to claim 1, wherein the temperature sensor includes,
   a first conductivity type first transistor, to a collector of which a constant current source is connected and a base of which is connected to the collector,
   a first conductivity type second transistor, a base of which is connected to the base of the first transistor,
   a first conductivity type third transistor, a base of which is connected to the base of the first transistor and the base of the second transistor,
   a first resistor, connected to an emitter of the first transistor,
   a second resistor, connected to an emitter of the second transistor, the second resistor being almost identical to the first resistor in temperature characteristic,
   a third resistor, connected to an emitter of the third transistor, the third resistor being almost identical to the second resistor in resistance value at the predetermined temperature but not in temperature characteristic,
   a second conductivity type fourth transistor, a collector and a base of which are connected to a collector of the second transistor and whose conductivity type is different from the first conductivity type,
   a second conductivity type fifth transistor, a collector of which is connected to a collector of the third transistor and a base of which is connected to the base of the fourth transistor, and
   an output terminal, connected between the collector of the third transistor and the collector of the fifth transistor to output the temperature characteristic signal,
   wherein the external inputting portion is connected between the emitter of the third transistor and the third resistor.

4. The function generating circuit according to claim 1, wherein the temperature sensor includes,
   a first conductivity type first transistor, to a collector of which a constant current source is connected and a base of which is connected to the collector,
   a first conductivity type second transistor, a base of which is connected to the base of the first transistor,
   a first conductivity type third transistor, a base of which is connected to the base of the first transistor and the base of the second transistor,
   a first resistor, connected to an emitter of the first transistor,
   a second resistor, connected to an emitter of the second transistor, the second resistor being almost identical to the first resistor in temperature characteristic,
   a third resistor, connected to an emitter of the third transistor, the third resistor being different from the second resistor in temperature characteristic,
   a second conductivity type fourth transistor, a collector and a base of which are connected to a collector of the second transistor and whose conductivity type is different from the first conductivity type,
   a second conductivity type fifth transistor, a collector of which is connected to a collector of the third transistor and a base of which is connected to the base of the fourth transistor,
   a fourth resistor, connected to an emitter of the fourth transistor, the fourth resistor being almost identical to the third resistor in temperature characteristic,
   a fifth resistor, connected to an emitter of the fifth transistor, the fifth resistor being almost identical to the first resistor in temperature characteristic, and
   an output terminal, connected between the collector of the third transistor and the collector of the fifth transistor to output the temperature characteristic signal,
   wherein a ratio of the resistance value of the second resistor and the resistance value of the third resistor is almost identical to a ratio of the resistance value of the fourth resistor and the resistance value of the fifth resistor at the predetermined temperature, and
   the external inputting portion is connected between the emitter of the third transistor and the third resistor.

5. The function generating circuit according to claim 1, wherein the temperature sensor includes,
   a first conductivity type first MOS transistor, to a drain of which a constant current source is connected and a gate of which is connected to the drain, a first conductivity type second MOS transistor, a gate of which is connected to the gate of the first MOS transistor, a first conductivity type third MOS transistor, a gate of which is connected to the gate of the first MOS transistor and the gate of the second MOS transistor, a first resistor, connected to a source of the first MOS transistor, a second resistor, connected to a source of the second MOS transistor, the second resistor being almost identical to the first resistor in temperature characteristic, a third resistor, connected to a source of the third MOS transistor, the third resistor being almost identical to the second resistor in resistance value at the predetermined temperature but not in temperature characteristic, a second conductivity type fourth MOS transistor, a drain and a gate of which are connected to a drain of the second MOS transistor and whose conductivity type is different from the first conductivity type, a second conductivity type fifth MOS transistor, a drain of which is connected to a drain of the third MOS transistor and a gate of which is connected to the gate of the fourth MOS transistor, and an output terminal, connected between the drain of the third MOS transistor and the drain of the fifth MOS transistor to output the temperature characteristic signal, wherein the external inputting portion is connected between the source of the third MOS transistor and the third resistor.

6. The function generating circuit according to claim 1, wherein the temperature sensor includes, a first conductivity type first MOS transistor, to a drain of which a constant current source is connected and a gate of which is connected to the drain, a first conductivity type second MOS transistor, a gate of which is connected to the gate of the first MOS transistor, a first conductivity type third MOS transistor, a gate of which is connected to the gate of the first MOS transistor and the gate of the second MOS transistor, a first resistor, connected to a source of the first MOS transistor, a second resistor, connected to a source of the second MOS transistor, the second resistor being almost identical to the first resistor in temperature characteristic, a third resistor, connected to a source of the third MOS transistor, the third resistor being different from the second resistor in temperature characteristic, a second conductivity type fourth MOS transistor, a drain and a gate of which are connected to a drain of the second MOS transistor and whose conductivity type is different from the first conductivity type, a second conductivity type fifth MOS transistor, a drain of which is connected to a drain of the third MOS transistor and a gate of which is connected to the gate of the fourth MOS transistor, a fourth resistor, connected to a source of the fourth MOS transistor, the fourth resistor being almost identical to the third resistor in resistance value and temperature characteristic, a fifth resistor, connected to a source of the fifth MOS transistor, the fifth resistor being almost identical to the first resistor in resistance value and temperature characteristic, and an output terminal, connected between the drain of the third MOS transistor and the drain of the fifth MOS transistor to output the temperature characteristic signal, wherein a ratio of the resistance value of the second resistor and the resistance value of the third resistor is almost identical to a ratio of the resistance value of the fourth resistor and the resistance value of the fifth resistor at the predetermined temperature, and the external inputting portion is connected between the source of the third MOS transistor and the third resistor.

7. A function generating circuit according to claim 1, further comprising:

a selecting portion, selecting any one of the external control signal from the external inputting portion and the temperature characteristic signal to output the selected signal to the function generating portion.

8. The function generating circuit according to claim 1, wherein the function signal has a cubic function characteristic.

9. A temperature compensated crystal oscillating circuit comprising:

the function generating circuit set forth in claim 1; and an oscillating circuit, an oscillation frequency of which is controlled based on the function signal that the function generating circuit outputs.

10. A crystal oscillating module comprising:

the temperature compensated crystal oscillating circuit set forth in claim 9; and a crystal oscillator.

11. A communication terminal comprising the crystal oscillating module set forth in claim 10.

12. A communication terminal comprising:

the temperature compensated crystal oscillating circuit set forth in claim 9; and a crystal oscillator.

13. A temperature characteristic controlling method for a function generating circuit having a temperature sensor for outputting a temperature characteristic signal in response to an ambient temperature, a function generating portion for generating a function signal based on an output signal of the temperature sensor, and a control data storing portion for recording control data to control the function signal, and an external inputting portion, inputting an external control signal to vary an input of the function generating portion, said method comprising the steps of:

inputting an external control signal to the temperature sensor in a state that the ambient temperature is at a predetermined temperature; and generating the function signal in response to the temperature characteristic signal that is output in answer to the input external control signal, wherein the temperature sensor outputs a difference between a first current generated by a resistor including a first linear temperature characteristic and a second current generated by a resistor including a second linear temperature characteristic as the temperature characteristic signal which is in proportion to the temperature, and varies a value of the first current or a value of the second current based on the external control signal.

* * * * *